United States Patent
Yoshida et al.

(10) Patent No.: US 6,865,203 B2
(45) Date of Patent: Mar. 8, 2005

(54) SEMICONDUCTOR LASER LIGHT EMITTING DEVICE

(75) Inventors: Hiroshi Yoshida, Kanagawa (JP); Misuzu Abe, Kanagawa (JP); Maho Ohara, Kanagawa (JP); Takashi Yamaguchi, Kanagawa (JP); Hiroshi Nakajima, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/815,670

(22) Filed: Mar. 23, 2001

(65) Prior Publication Data

US 2002/0003823 A1 Jan. 10, 2002

(30) Foreign Application Priority Data

Mar. 24, 2000 (JP) .................................... P2000-083368

(51) Int. Cl.[7] .............................................. H01S 5/00
(52) U.S. Cl. ............................................ 372/46; 372/45
(58) Field of Search ..................................... 372/43–50

(56) References Cited

U.S. PATENT DOCUMENTS 5,923,690 A * 7/1999 Kume et al. .................. 372/46

FOREIGN PATENT DOCUMENTS

| JP | 09-232680 A | * | 9/1997 | ............. H01S/3/18 |
| JP | 10-093140 A | * | 4/1998 | ............. H01S/3/18 |
| JP | 11204882 A | * | 7/1999 | ............. H01S/3/18 |

* cited by examiner

Primary Examiner—Quyen Leung
(74) Attorney, Agent, or Firm—Sonnenschein, Nath & Rosenthal LLP

(57) ABSTRACT

Disclosed is a semiconductor laser light emitting device including: a stacked film composed of a stack of group III nitride semiconductor films each containing at least one kind selected from aluminum, gallium, indium, and boron; wherein an upper portion of the stacked film is formed into a ridge-like stripe, to form a current injection region; a current non-injection region formed on both sides of the ridge-like stripe; and at least part of the current non-injection region is made from a material expressed by a chemical formula $Al_xGa_{1-x}N$ ($0 \leq x \leq 1.0$). In this device, the component ratio "x" of Al is specified at a value in a range of $0.3 \leq x \leq 1.0$, so that the semiconductor laser light emitting device is configured as an index guide type semiconductor laser light emitting device; the component ratio "x" of Al is specified at a value in a range of $0.15 < x < 0.30$, so that the semiconductor laser light emitting device is configured as a weak index type pulsation semiconductor laser light emitting device; or the component ratio "x" of Al is specified at a value in a range of $0 \leq x \leq 0.15$, so that the semiconductor laser light emitting device is configured as a gain guide type laser light emitting device.

5 Claims, 13 Drawing Sheets

FIG. 3
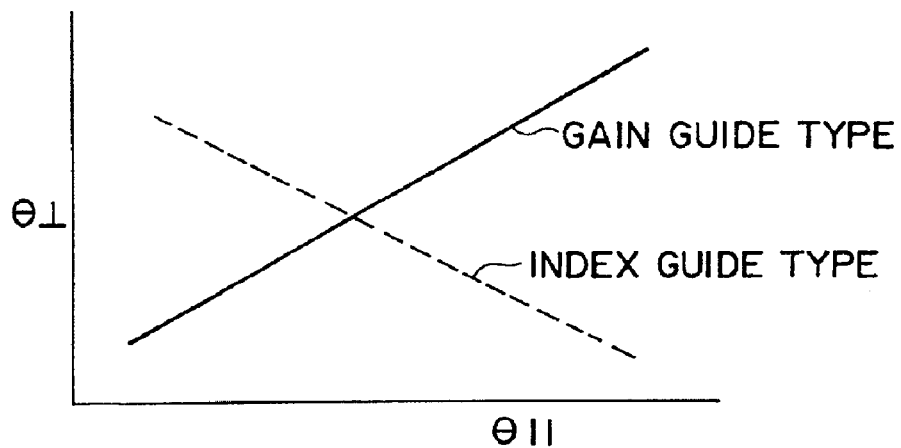
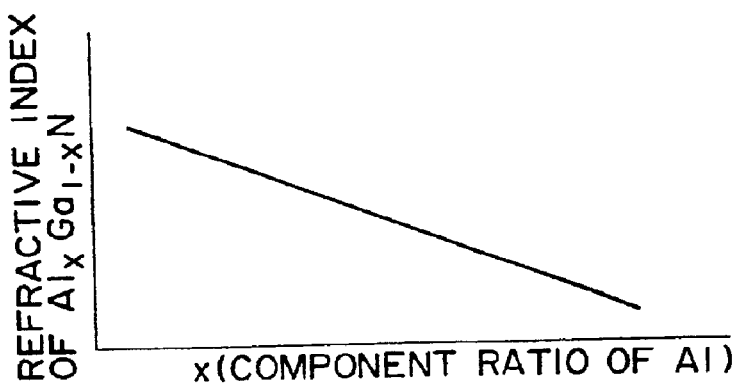
FIG. 4A
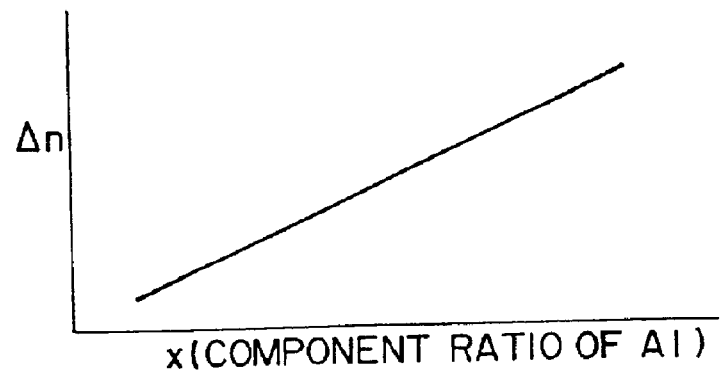
FIG. 4B

SEMICONDUCTOR LASER LIGHT EMITTING DEVICE

RELATED APPLICATION DATA

The present application claims priority to Japanese Application No. P2000-083368 filed Mar. 24, 2000, which application is incorporated herein by reference to the extent permitted by law.

BACKGROUND OF THE INVENTION

The present invention relates to a semiconductor laser light emitting device, and particularly to a semiconductor laser light emitting device including a stack of group III nitride semiconductor films.

A semiconductor laser light emitting device of a type including a stack of semiconductor films made from group III nitrides each containing at least one kind selected from aluminum, gallium, indium, and boron (hereinafter, referred to as "group III nitride semiconductor light emitting device") has been disposed as a useful component of various systems, and a system using such a semiconductor laser light emitting device as a light source is being realized.

The group III nitride semiconductor laser light emitting device is inferior to semiconductor laser light emitting devices of a type including a stack of semiconductor films made from other materials, for example, an AlGaAs based semiconductor laser light emitting device used for compact disks (CDs) and mini-disks (MDs) and an AlGaInP based semiconductor laser light emitting device used for digital versatile disks (DVDS) and bar-code readers in various points one of which is a transverse mode control.

The transverse mode is a light waveguide mode in the in-plane direction of a semiconductor film, and a method of controlling the transverse mode in a semiconductor laser light emitting device has been established. Referring to FIG. 13, there is shown a stacked semiconductor film 311. Now, assuming that a stacking direction of the stacked semiconductor film 311 is taken as a vertical direction; a direction within a plane of the stacked semiconductor film 311 and perpendicular to the length direction of a resonator including the stacked semiconductor film 311 as a main component is taken as a horizontal direction; and the length direction of the resonator is taken as a longitudinal direction, the above-described transverse mode is a light waveguide mode in the horizontal direction.

The mechanism of generating a horizontal light waveguide mode in a semiconductor laser light emitting device is generally classified into two mechanisms.

One light waveguide mechanism is obtained by a structure shown in FIG. 14A, in which the configuration of a semiconductor film 320 in the vertical direction is made constant between a current injection portion 321 and a current non-injection portion 322. In such a structure, a built-in differential refractive index Δn between a refractive index n1 of the current injection portion 321 and a refractive index n2 of the current non-injection portion 322 becomes zero (Δn=0), so that at the time of current injection, a distribution of refractive indexes in the horizontal direction as shown in FIG. 14B occurs and thereby a distribution of carriers as shown in FIG. 14C occurs. As a result, a light waveguide mechanism, called as a gain guide waveguide mechanism, is generated.

The other light waveguide mechanism is obtained by a structure shown in FIG. 15A, in which the configuration of a semiconductor film 330 in the vertical direction is made different between a current injection portion 331 and a current non-injection portion 332. In such a structure, a built-in differential refractive index Δn between a refractive index n1 of the current injection portion 321 and a refractive index n2 of the current non-injection portion 322 does not become zero (Δn=n1-n2≠0), so that at the time of current injection, a distribution of refractive indexes in the horizontal direction as shown in FIG. 15B occurs and thereby a distribution of carriers as shown in FIG. 15C occurs. As a result, a light waveguide mechanism, called as an index guide waveguide mechanism, is generated.

In general, the index guide waveguide mechanism is further classified into two mechanisms. One mechanism in which waveguide of light occurs if a real portion of the differential refractive index is larger than zero [(Δn-real) >0] is called a rear index guide type, and the other mechanism in which waveguide of light occurs if an imaginary portion of the differential refractive index is smaller than zero [(Δn-im)<0] is called a loss index guide type. To stably keep the transverse mode at a higher output, the loss index guide type semiconductor laser light emitting device is superior to the gain guide type semiconductor laser light emitting device. From the viewpoint of operational current, the real index guide type semiconductor laser light emitting device is superior to the loss index guide type semiconductor laser light emitting device.

The light waveguide mechanism can be more finely classified as follows: namely, at a value of Δn between a value realizing the gain guide type and a value realizing the index guide type, self-pulsation occurs, and such a mechanism realized at a weak value of Δn is called a weak index type self-pulsation waveguide mechanism.

Each of the commercial available semiconductor laser light emitting devices such as the AlGaAs based semiconductor laser light emitting device used for CDs and MDs and the AlGaInP based semiconductor laser light emitting device used for DVDs and bar-code readers adopts a transverse mode waveguide mechanism which is varied depending on its application by changing its film structure. More specifically, in these commercial available semiconductor light emitting devices, values of Δn are arbitrarily changed.

For example, for the purpose of preferentially reducing laser noise with lower power drive, the gain guide type is selected as the transverse mode waveguide mechanism, and for the purpose of most preferentially reducing laser noise, the pulsation type is selected as the transverse mode waveguide mechanism. On the other hand, for the purpose of preferentially stabilizing a radiation angle [(Far Field Pattern (FFP)] and an astigmatism of a laser beam with a high power drive, or for the purpose of preferentially reducing a drive current, the index guide type is selected as transverse mode waveguide mechanism.

From the above description, it becomes apparent that the transverse mode of the group III nitride semiconductor laser light emitting device is needed to be controlled, that is, varied depending on its application in accordance with the same manner as that adopted by the commercial available semiconductor laser light emitting devices such as the AlGaAs based semiconductor laser light emitting device used for CDs and MDs and the AlGaInP based semiconductor laser light emitting device used for DVDs and bar-code readers.

The group III nitride semiconductor laser light emitting device using a buried ridge structure, however, is difficult to control the transverse mode in the same manner as that adopted by the commercial available semiconductor laser light emitting devices. The reasons for this are as follows:

(1) In the group III nitride semiconductor laser light emitting device, the details of a buried layer have been not made clear.

(2) To control the transverse mode, it is required to examine a differential refractive index $\Delta n$ between an effective refractive index $n1$ of a current injection region in the film stacking direction and an effective refractive index $n2$ of a current non-injection region in the film stacking direction; however, any group III nitride semiconductor laser light emitting device attempted to examine the differential refractive index $\Delta n$ has been not disclosed. Accordingly, from the viewpoint of transverse mode control, it has failed to desirably design and produce a group III nitride semiconductor laser light emitting device.

(3) For example, Japanese Patent Laid-open No. Hei 11-214788 has disclosed a buried ridge type semiconductor laser light emitting device, wherein an insulating film or a semiconductor film is taken as a buried layer. In this document, however, a thickness $d2$ from an active layer and a current non-injection region has been not described. The thickness $d2$ is an important structural parameter for determining the differential refractive index $\Delta n$, and accordingly, unless the thickness $d2$ is made clear, the differential refractive index $\Delta n$ cannot be determined. The invention disclosed in the above document, Japanese Patent Laid-open No. Hei 11-214788 is intended to achieve self-pulsation by adopting the weak index type waveguide mechanism; however, since the thickness $d2$ is not made clear, the differential refractive index $\Delta n$ cannot be determined, and therefore, it fails to product a self-pulsation type semiconductor laser light emitting device.

(4) Even in related art inventions other than that disclosed in the above document, the relationship between the differential refractive index $\Delta n$ and the transverse mode has not been made clear, and the transverse mode has been specified only by a material composition or a stripe width.

The reason for this is supposed to be due to the fact that a ridge structure in direct-contact with a metal film or an insulating film has been adopted in study and development of group III nitride semiconductor laser light emitting devices. In the ridge structure in direct-contact with a metal film, since leak failures frequently occur, the thickness $d2$ cannot be positively made small and thereby the differential refractive index $\Delta n$ is unclear, with a result that the transverse mode cannot be examined on the basis of the differential refractive index $\Delta n$. Such a ridge structure causes another problem that a leak current outside the ridge structure becomes larger and thereby an operational current becomes larger.

In the group III nitride semiconductor laser light emitting device, the increased drive power causes an increase in heat generation, and at the worst case, makes it difficult to perform laser oscillation. The increased drive voltage also makes it difficult to specify a current injection width Wst of a current injection region, and thereby tends to degrade the stability of the transverse mode. This is one of factors of making it difficult to examine the transverse mode.

(5) On the other hand, in a structure buried in a power constriction region by using an insulating film, no leak failure occurs even if the thickness $d2$ becomes thinner, so that the differential refractive index $\Delta n$ can be made sufficiently larger. In this structure, however, since the adhesion degree and film quality are uneven on both side surfaces of a ridge stripe, the transverse mode becomes unstable, thereby failing to examine the transverse mode. Further, since the refractive index of the power constriction region is fixed at a specific value and is not changed, the differential refractive index $\Delta n$ is adjusted only by controlling the thickness $d2$; however, such a control of the thickness $d2$ exerts an effect on leak current, with a result that it becomes difficult to independently adjust the spread of a current and the spread of light-Accordingly, the production of the buried ridge structure using an insulating film is poor in advantage from the practical viewpoint.

(6) To solve the above-described various problems of the buried ridge structure using a metal or insulating film, a buried ridge structure using a semiconductor film may be preferably used. However, even in a semiconductor laser light emitting device having the buried structure using a semiconductor film, since a correlation between the differential refractive index $\Delta n$ and the transverse mode is not clear, it is impossible to desirably select the transverse structure depending on the application of the device.

SUMMARY OF THE INVENTION

An object of the present invention is to provide a semiconductor laser light emitting device having a buried structure using a semiconductor film, wherein a transverse structure can be selected depending on the application of the device by making a correlation between a differential refractive index $\Delta n$ and a transverse mode.

To achieve the above object, according to an aspect of the present invention, there is provided a first semiconductor laser light emitting device including a stacked film composed of a stack of group III nitride semiconductor films each containing at least one kind selected from aluminum, gallium, indium, and boron, wherein an upper portion of the stacked film is formed into a ridge-like stripe, to form a current injection region, a current non-injection region formed on both sides of the ridge-like stripe, and at least part of the current non-injection region is made from a material expressed by a chemical formula $Al_xGa_{1-x}N$ ($0 \leq x \leq 1.0$). The first semiconductor laser light emitting device is characterized in that the component ratio "x" of Al is specified at a value in a range of $0.3 \leq x \leq 1.0$, so that the semiconductor laser light emitting device is configured as an index guide type semiconductor laser light emitting device.

Preferably, a current injection width Wst of the current injection region is specified at a value in a range of $1 \mu m \leq Wst \leq 3 \mu m$; part, present between an active layer and the current non-injection region, of the stacked film under the current non-injection region at least includes a film which is made from a material expressed by a chemical formula $Al_xGa_{1-x}N$ ($0.3 \leq x \leq 1.0$) and which has a thickness of $0.2 \mu m$ or less; and a difference $\Delta n$ between an effective refractive index $n1$ of the current injection region in the film stacking direction and an effective refractive index $n2$ of the current non-injection region in the film stacking direction is in a range of $0.07 \leq \Delta n = (n1-n2) \leq 0.012$.

In the first semiconductor laser light emitting device, since the component ratio "x" of Al is specified at a value in the range of $0.3 \leq x \leq 1.0$, a negative correlation is given between a full width at half maximum (FWHM) $\theta\|$ of a far field pattern (FFP) in the horizontal direction and a FWHM $\theta\perp$ of the FFP in the vertical direction and further the FWHM $\theta\|$ becomes larger as the current injection width Wst becomes narrower, with a result that the light waveguide mechanism of the device becomes an index guide waveguide mechanism for the component ratio "x" of Al in the above range. Also, since the current injection width Wst of the current injection region is in the range of 1 $\mu m \leq Wst \leq 3$ $\mu m$, a drive current is reduced, thereby enabling low current drive. If $Wst > 3.0$ $\mu m$, the light waveguide mechanism becomes weak and thereby light confinement in the horizontal direction becomes unstable, and the light waveguide mechanism acts as a gain guide waveguide mechanism for all the values of "x". Further, since part, present between an active layer and the current non-injection region, of the stacked film under the current non-injection region at least includes a film which is made from a material expressed by a chemical formula $Al_xGa_{1-x}N$ ($0.3 \leq x \leq 1.0$) and which has a thickness of 0.2 $\mu m$ or less, leak current can be suppressed. If the thickness of the above film made from $Al_xGa_{1-x}N$ ($0.3 \leq x \leq 1.0$) is larger than 0.2 $\mu m$, leak current becomes larger, thereby deteriorating the performance of the semiconductor laser light emitting device.

According to another aspect of the present invention, there is provided a second semiconductor laser light emitting device including a stacked film composed of a stack of group III nitride semiconductor films each containing at least one kind selected from aluminum, gallium, indium, and boron, wherein an upper portion of the stacked film is formed into a ridge-like stripe, to form a current injection region, a current non-injection region formed on both sides of the ridge-like stripe, and at least part of the current non-injection region is made from a material expressed by a chemical formula $Al_xGa_{1-x}N$ ($0 \leq x \leq 1.0$). The second semiconductor laser light emitting device is characterized in that the component ratio "x" of Al is specified at a value in a range of $0.15 < x < 0.30$, so that the semiconductor laser light emitting device is configured as a weak index type pulsation semiconductor laser light emitting device.

Preferably, a current injection width Wst of the current injection region is specified at a value in a range of 1 $\mu m \leq Wst \leq 3$ $\mu m$; part, present between an active layer and the current non-injection region, of the stacked film under the current non-injection region at least includes a film which is made from a material expressed by a chemical formula $Al_xGa_{1-x}N$ ($0.15 < x < 0.30$) and which has a thickness of 0.2 $\mu m$ or less; and a difference $\Delta n$ between an effective refractive index n1 of the current injection region in the film stacking direction and an effective refractive index n2 of the current non-injection region in the film stacking direction is in a range of $0 < \Delta n = (n1-n2) < 0.007$.

In the second semiconductor laser light emitting device, since the component ratio "x" of Al is specified at a value in the range of $0.15 < x < 0.30$, the differential refractive index $\Delta n$ is too small to realize the index guide type waveguide mechanism. Accordingly, the light waveguide mechanism of the device becomes a weak index type waveguide mechanism. Also, since the current injection width Wst of the current injection region is in the range of 1 $\mu m \leq Wst \leq 3$ $\mu m$, a drive current is reduced, thereby enabling low current drive. If $Wst > 3$ $\mu m$, the light waveguide mechanism becomes weak and thereby light confinement in the horizontal direction becomes unstable, and the light waveguide mechanism acts as a gain guide waveguide mechanism for all the values of "x". Further, since part, present between an active layer and the current non-injection region, of the stacked film under the current non-injection region at least includes a film which is made from a material expressed by a chemical formula $Al_xGa_{1-x}N$ ($0.3 \leq x \leq 1.0$) and which has a thickness of 0.2 $\mu m$ or less, leak current can be suppressed. If the thickness of the above film made from $Al_xGa_{1-x}N$ ($0.3 \leq x \leq 1.0$) is larger than 0.2 $\mu m$, leak current becomes larger, thereby deteriorating the performance of the semiconductor laser light emitting device.

According to a further aspect of the present invention, there is provided a third semiconductor laser light emitting device including a stacked film composed of a stack of group III nitride semiconductor films each containing at least one kind selected from aluminum, gallium, indium, and boron, wherein an upper portion of the stacked film is formed into a ridge-like stripe, to form a current injection region, a current non-injection region formed on both sides of the ridge-like stripe, and at least part of the current non-injection region is made from a material expressed by a chemical formula $Al_xGa_{1-x}N$ ($0 \leq x \leq 1.0$). The third semiconductor laser light emitting device is characterized in that the component ratio "x" of Al is specified at a value in a range of $0 \leq x \leq 0.15$, so that the semiconductor laser light emitting device is configured as a gain guide type laser light emitting device.

Preferably, a current injection width Wst of the current injection region is specified at a value in a range of 1 $\mu m \leq Wst \leq 3$ $\mu m$; part, present between an active layer and the current non-injection region, of the stacked film under the current non-injection region at least includes a film which is made from a material expressed by a chemical formula $Al_xGa_{1-x}N$ ($0 \leq x \leq 0.15$) and which has a thickness of 0.2 $\mu m$ or less; and a difference $\Delta n$ between an effective refractive index n1 of the current injection region in the film stacking direction and an effective refractive index n2 of the current non-injection region in the film stacking direction is in a range of $0 < \Delta n = (n1-n2) < 0.007$.

In the third semiconductor laser light emitting device, since the component ratio "x" of Al is specified at a value in the range of $0 \leq x \leq 0.15$, the light waveguide mechanism of the device becomes a gain guide type waveguide mechanism suitable for drive with low laser noise. Also, since the current injection width Wst of the current injection region is in the range of 1 $\mu m \leq Wst \leq 3$ $\mu m$, a drive current is reduced, thereby enabling low current drive. Further, since part, present between an active layer and the current non-injection region, of the stacked film under the current non-injection region at least includes a film which is made from a material expressed by a chemical formula $Al_xGa_{1-x}N$ ($0 \leq x \leq 0.15$) and which has a thickness of 0.2 $\mu m$ or less, leak current can be suppressed. If the thickness of the above film made from $Al_xGa_{1-x}N$ ($0 \leq x \leq 0.15$) is larger than 0.2 $\mu m$, leak current becomes larger, thereby deteriorating the performance of the semiconductor laser light emitting device.

BRIEF DESCRIPTION OF THE DRAWINGS

FIG. 3 is a graph showing a typical relationship between the FWHM $\theta\|$ and a FWHM $\theta\perp$ of the FFP in the vertical direction for each of various current injection widths Wst;

FIGS. 4A and 4B are graphs showing a relationship between a component ratio "x" of Al and a differential refractive index $\Delta n$;

DETAILED DESCRIPTION OF THE PREFERRED EMBODIMENTS

Hereinafter, preferred embodiments of the present invention will be described with reference to the drawings.

Figure 1:
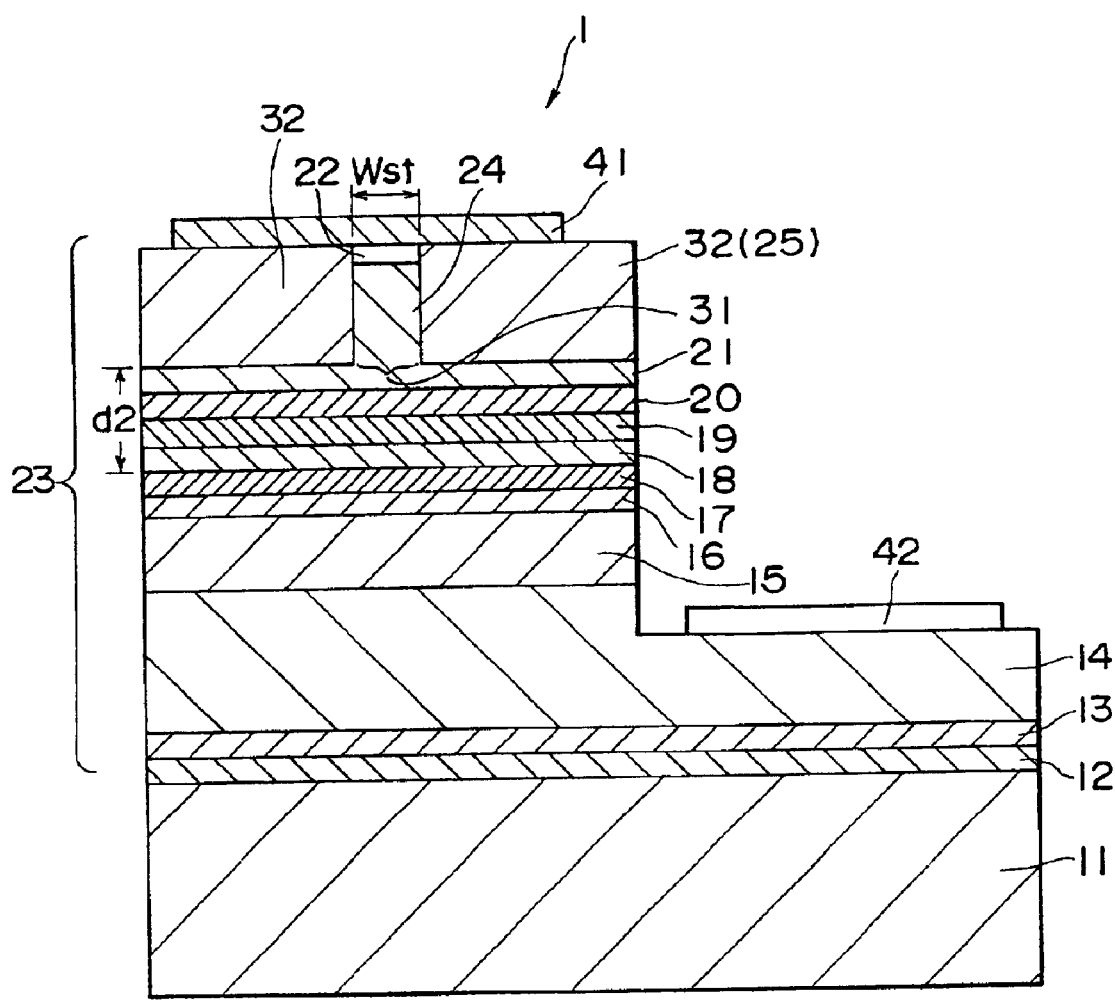
FIG. 1 is a schematic sectional view showing a configuration of a semiconductor laser light emitting device.

FIG. 1 is a schematic sectional view showing a basic configuration of a semiconductor laser light emitting device 1 to which the present invention is applied. As shown in this figure, the semiconductor laser light emitting device 1 is configured such that group III nitride semiconductor films are sequentially stacked on a sapphire substrate 11. These semiconductor films are a buffer film 12 (thickness: 35 nm) made from gallium nitride; a low temperature layer 13 (thickness: 500 nm) made from undoped gallium nitride; a contact layer 14 (thickness: 8 μm) made from silicon-doped n-type gallium nitride; an n-type cladding layer 15 (thickness: 1.2 μm) made from silicon-doped n-type $Al_{0.08}Ga_{0.92}N$; an optical guide layer 16 (thickness: 120 nm) made from silicon-doped n-type gallium nitride; an active layer 17 having a quadruple quantum well structure of well layers (thickness: 3.5 nm for each layer) made from $In_{0.14}Ga_{0.86}N$ and barrier layers (thickness: 7 nm for each layer) made from $In_{0.02}Ga_{0.98}N$; a diffusion preventive layer 18 (thickness: 20 nm) made from magnesium-doped p-type gallium nitride; an optical guide layer 19 (thickness: 90 nm) made from magnesium-doped p-type gallium nitride; a carrier overflow suppressing layer 20 (thickness: 50 nm) made from magnesium-doped p-type $Al_{0.08}Ga_{0.92}N$; a p-type cladding layer 21 (thickness: 560 nm) made from magnesium-doped p-type $Al_{0.06}Ga_{0.94}N$; and a p-type contact layer 22 (thickness: 100 nm) made from magnesium-doped p-type gallium nitride. These stacked films 12 to 22 are called a stacked film 23.

An upper portion of the p-type cladding layer 21 is formed into a ridge-like stripe 24. The stripe 24 becomes a current injection region 31. A current injection width Wst of the current injection region 31 is specified at a value in a range of 1 μm≤Wst≤3 μm.

On the other hand, a silicon-doped $Al_xGa_{1-x}N$ layer 25 for current constriction is formed on both sides of the stripe 24 which becomes a current non-injection portion 32. The thickness of the current non-injection portion 32 is determined by sequentially removing, before formation of the $Al_xGa_{1-x}N$ layer 25 (current non-injection portion 32), the p-type contact layer 22 and the p-type cladding layer 21 to such a depth that a film thickness d2 from the active layer 17 to the current non-injection portion 32 becomes a specific value. This transverse current constriction structure also constitutes a transverse light waveguide mode control structure.

Finally, a p-type electrode 41 to be connected to the p-type contact layer 22 is formed on the p-type contact layer 22, and an n-type electrode 42 to be connected to the n-type contact layer 14 is formed on the n-type contact layer 14.

According to a first embodiment of the present invention, the semiconductor laser light emitting device 1 shown in FIG. 1 is configured as an index guide type semiconductor laser light emitting device in which the current non-injection region 32 is made from the $Al_xGa_{1-x}N$ layer 25, wherein the component ratio "x" of Al is specified at a value in a range of 0.3≤x≤1.0, which device is hereinafter referred to as "first semiconductor laser light emitting device".

The first semiconductor laser light emitting device is further characterized as follows:

(1) The current injection width Wst of the current injection region 31 formed into the ridge-like stripe is specified at a value in a range of 1 μm≤Wst≤3 μm.

(2) Part, present between the active layer 17 and the current non-injection region 32, of the stacked film under the current non-injection region 32, that is, the films composed of the diffusion preventive layer 18, optical guide layer 19, carrier overflow suppressing layer 20, and cladding layer 21 include at least one film which is made from a material expressed by a chemical formula $Al_xGa_{1-x}N$ (0.3≤x≤1.0) and which has a thickness of 0.2 μm or less.

(3) A differential refractive index Δn between an effective refractive index n1 of the current injection region 31 in the film stacking layer and an effective refractive index n2 of the current non-injection region 32 in the film stacking direction is specified in a range of 0.007≤Δn (n1-n2)≤0.012.

According to a second embodiment of the present invention, the semiconductor laser light emitting device 1 shown in FIG. 1 is configured as a weak index guide type semiconductor laser light emitting device in which the current non-injection region 32 is made from the $Al_xGa_{1-x}N$ layer 25, wherein the component ratio "x" of Al is specified at a value in a range of 0.15<x<0.30, which device is hereinafter referred to as "second semiconductor laser light emitting device".

The second semiconductor laser light emitting device is further characterized as follows:

(1) The current injection width Wst of the current injection region 31 formed into the ridge-like stripe is specified at a value in a range of 1 μm≤Wst≤3 μm.

(2) Part, present between the active layer 17 and the current non-injection region 32, of the stacked film under the current non-injection region 32, that is, the films composed of the diffusion preventive layer 18, optical guide layer 19, carrier overflow suppressing layer 20, and cladding layer 21 include at least one film which is made from a material expressed by a chemical formula $Al_xGa_{1-x}N$ (0.15<x<0.30) and which has a thickness of 0.2 μm or less.

(3) A differential refractive index Δn between an effective refractive index n1 of the current injection region 31 in the film stacking direction and an effective refractive index n2 of the current non-injection region 32 in the film stacking direction is specified in a range of 0<Δn (n1-n2)<0.007.

According to a third embodiment of the present invention, the semiconductor laser light emitting device 1 shown in FIG. 1 is configured as a gain guide type semiconductor laser light emitting device in which the current non-injection region 32 is made from the $Al_xGa_{1-x}N$ layer 25, wherein the component ratio "x" of Al is specified at a value in a range of 0≦x≦0.15, which device is hereinafter referred to as "third semiconductor laser light emitting device".

The third semiconductor laser light emitting device is further characterized as follows:

(1) The current injection width Wst of the current injection region 31 formed into the ridge-like stripe is specified at a value in a range of 1 μm≦Wst≦3 μm.

(2) Part, present between the active layer 17 and the current non-injection region 32, of the stacked film under the current non-injection region 32, that is, the films composed of the diffusion preventive layer 18, optical guide layer 19, carrier overflow suppressing layer 20, and cladding layer 21 include at least one film which is made from a material expressed by a chemical formula $Al_xGa_{1-x}N$ (0≦x≦0.15) and which has a thickness of 0.2 μm or less.

(3) A differential refractive index Δn between an effective refractive index n1 of the current injection region 31 in the film stacking direction and an effective refractive index n2 of the current non-injection region 32 in the film stacking direction is specified in a range of 0<Δn (n1-n2)<0.007.

Hereinafter, a method of estimating the component ratio "x" of Al, the current injection width (or stripe width) Wst of the current injection region 31, and the differential refractive index Δn for the semiconductor laser light emitting device 1 of the present invention will be described. As samples, various kinds of buried ridge type semiconductor laser light emitting devices each having the configuration shown in FIG. 1 were prepared. In these samples, the component ratio "x" of Al of $Al_xGa_{1-x}N$ was varied, and the current injection width (stripe width) Wst was varied for each component ratio "x" of Al.

To be more specific, the parameters "x", "d2", and "Wst" used for production of the samples were set at values in ranges of 0.15≦x≦1.0, 0.1 μm≦d2≦0.2 μm, and 2.2 μm≦Wst≦3.5 μm, respectively.

Figure 2:
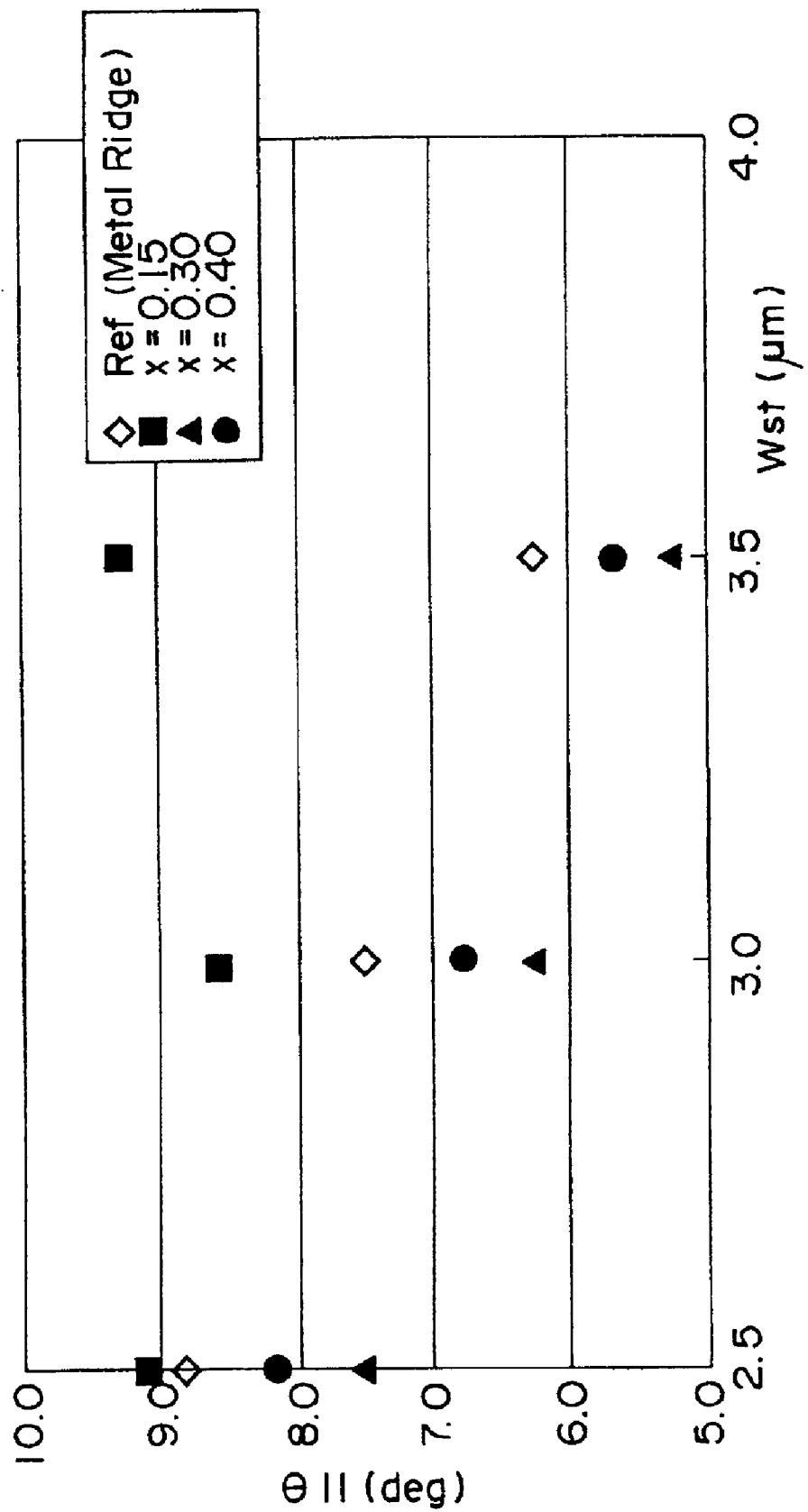
FIG. 2 is a graph showing a relationship between a FWHM (full width at half maximum) $\theta\|$ of a FFP (Far Field Pattern) in the horizontal direction and a current injection width Wst for each of various differential refractive indexes "x"

First, a result of measuring a FWHM (Full Width at Half Maximum) θ∥ of a FFP (Far Field Pattern) in the horizontal direction for each of samples (x=0.15, 0.30, and 0.40) is shown in FIG. 2. In this figure, the ordinate indicates the FWHM θ∥ and the abscissa indicates the stripe width Wst. For comparison, data for a general group III nitride semiconductor laser light emitting device having a ridge structure covered with a p-type metal layer is shown by a rhomboid open mark in FIG. 2. In addition, the thickness d2 was set to about 0.15 μm. In measurement of the FFP, a laser oscillator was driven by applying a pulse current, for example, having a width of 5 μs at a cycle of 1 ms in order to avoid an effect due to self-heat generation of the laser oscillator as much as possible.

From the data shown in FIG. 2, the following features (1) and (2) become apparent.

(1) At the values of "x" excluding 0.15, a negative correlation is given between θ∥ and Wst.

(2) At all the values of Wst, the values of θ∥ satisfy a relationship of $\theta\|_{x=0.15} > \theta\|_{x=0.40} > \theta\|_{x=0.30}$.

Next, a typical relationship between the FWHM θ∥ and a FWHM θ⊥ (FWHM of the FFP in the vertical direction) for each of various stripe widths Wst is shown in FIG. 3. In this figure, the abscissa indicates the FWHM θ∥ and the ordinate indicates the FWHM θ⊥. In the gain guide type semiconductor laser light emitting device, as the stripe width Wst becomes narrower, the loss in the horizontal direction becomes larger, so that the curvature of a light wave plane in the horizontal direction becomes stronger, with a result that the FWHM θ∥ becomes larger. At this time, the loss becomes larger even in the vertical direction, so that the curvature of the light wave plane in the vertical direction becomes larger, with a result that θ⊥ becomes larger. In this way, as shown in FIG. 3, a positive correlation is given between the FWHMs θ∥ and θ⊥, and further, as the stripe width Wst becomes narrower, both the FWHMs θ∥ and θ⊥ become larger.

On the other hand, in the index guide type semiconductor laser light emitting device, as shown in FIG. 3, a negative correlation is given between the FWHMs θ∥ and θ⊥. The reason for this is due to the fact that a TE mode is not perpendicular to a TM mode. These phenomena are recognized even in measurement of an AlGaAs based semiconductor laser light emitting device or an AlGaInP based semiconductor laser light emitting device.

Accordingly, the following features (3) and (4) become apparent.

(3) In the index guide type semiconductor laser light emitting device, a negative correlation is given between the FWHMs θ∥ and θ⊥, and further, as the stripe width Wst becomes narrower, the FWHM θ∥ becomes larger.

(4) In the gain guide type semiconductor laser light emitting device, a positive correlation is given between the FWHMs θ∥ and θ⊥, and further, as the stripe width Wst becomes narrower, the FWHM θ∥ becomes larger.

A relationship between the component ratio "x" of Al and the differential refractive index Δn for the index guide type semiconductor laser light emitting device will be described with reference to FIGS. 4A and 4B. In these figures, the abscissa indicates the component ratio "x" of Al and the ordinate indicates the differential refractive index Δn.

As shown in FIG. 4A, as the component ratio "x" of Al becomes larger, the refractive index of the $Al_xGa_{1-x}N$ layer becomes smaller. This means that, as shown in FIG. 4B, when the thickness d2 is fixed, as the component ratio "x" of Al becomes larger, the difference between the effective refractive indexes n1 and n2 of the regions inside and outside the stripe in the vertical direction, that is, the differential refractive index Δn becomes larger.

Accordingly, the following features (5) and (6) become apparent.

(5) In the index guide type semiconductor laser light emitting device, when the thickness d2 is fixed, a positive correlation is given between the FWHM θ∥ and the component ratio "x" of Al.

(6) With the thickness d2 and the stripe width Wst fixed, the FWHM θ∥ of the index guide type semiconductor laser light emitting device is larger than the FWHM θ∥ of the gain guide type semiconductor laser light emitting device. This is well known, and is due to the fact that the curvature of a light wave plane occurs in the gain guide type semiconductor laser light emitting device.

Figure 5:
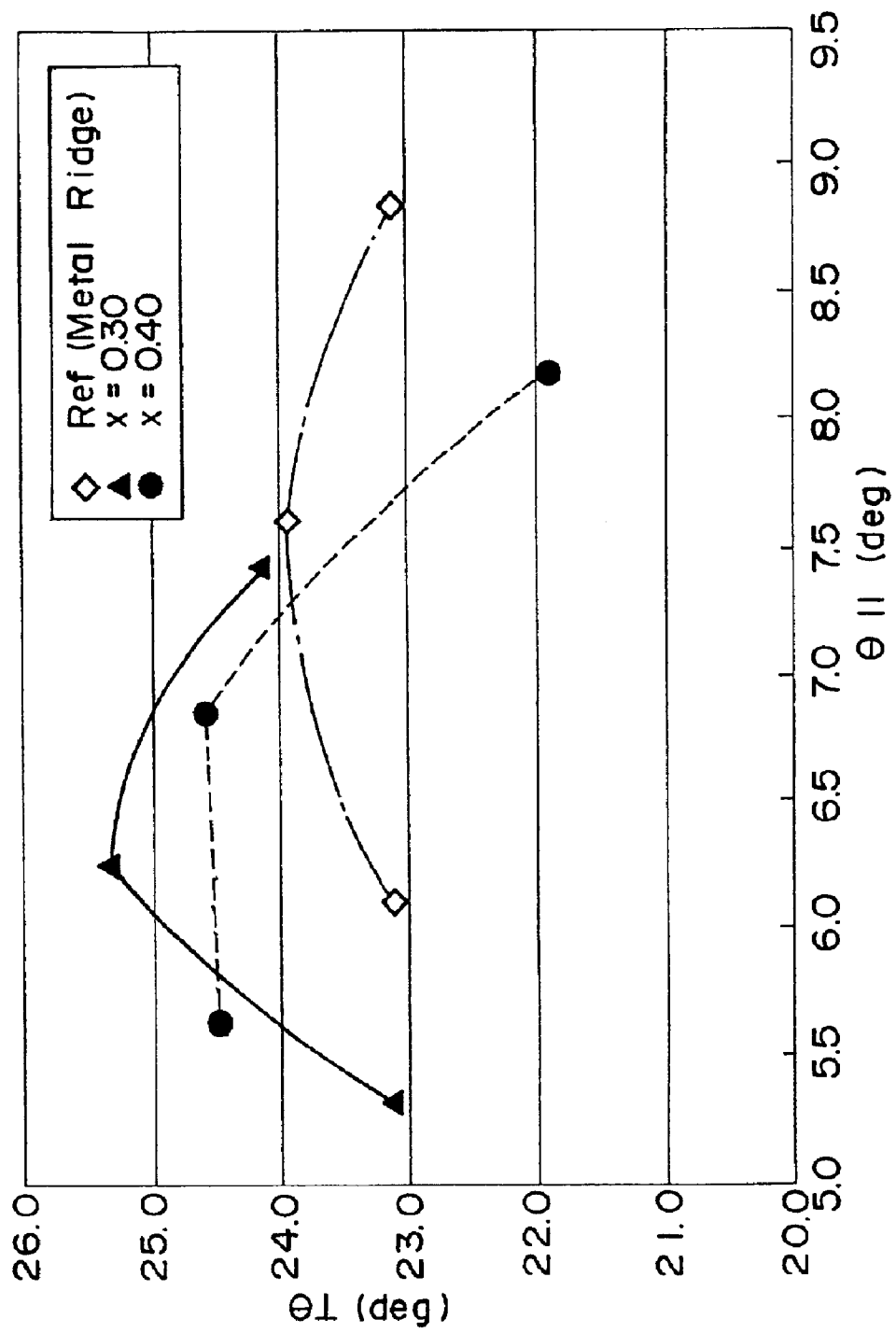
FIG. 5 is a graph showing a relationship showing a relationship between the FWHM $\theta\|$ and the FWHM $\theta\perp$.

A relationship between the FWHMs θ∥ and θ⊥ is shown in FIG. 5, in which the abscissa indicates the FWHM θ∥ and the ordinate indicates the FWHM θ⊥. As shown in FIG. 5, the measured points are the same as those in FIG. 2. The relationship between the FWHMs θ∥ and θ⊥ for the index guide type semiconductor laser light emitting device is different from that for the gain guide type semiconductor laser light emitting device.

From the features (1) to (6) described with reference to FIGS. 2 to 5, the following conclusions are obtained.

(a) For all the component ratios "x" of Al (0.15≦x≦0.40), if Wst>3 μm, the semiconductor laser light emitting device acts as the gain guide type semiconductor laser light emitting device.

(b) If Wst≦3 μm, the gain guide type semiconductor laser light emitting device is changed into the index guide type semiconductor laser light emitting device at a value of "x" between 0.15 to 0.30.

(c) If Wst≦3 μm, the semiconductor laser light emitting device acts as the index guide type semiconductor laser light emitting device at a value of "x" between 0.30 and 0.40.

That is to say, the differential refractive index Δn is sufficiently large at the component ratio "x" (=0.30) of Al, so that the semiconductor laser light emitting device becomes the index guide type semiconductor laser light emitting device. Accordingly, to obtain a laser oscillator required to be driven at a lower drive current and a higher output of light, it may be desirable that the component ratio "x" of Al be set to 0.30.

Additionally, at the component ratio "x" (=0.15) of Al, since the light waveguide mechanism becomes the gain guide type, if the stripe width Wst becomes wider, light is fluctuated and is thereby not collected to the center. Such deflection of light causes a phenomenon in which light is collected to the deflected position, with a result that the stripe width Wst is not fixed.

As described above, the semiconductor laser light emitting device of the present invention becomes the index guide type semiconductor laser light emitting at a component ratio of Al in the range of 0.30≦x≦1, the weak index pulsation type semiconductor laser light emitting device at a component ratio of Al in the range of 0.15<x<0.30, and the gain guide type semiconductor laser light emitting device at a component ratio of Al in the range of 0≦x≦0.15.

Figure 6:
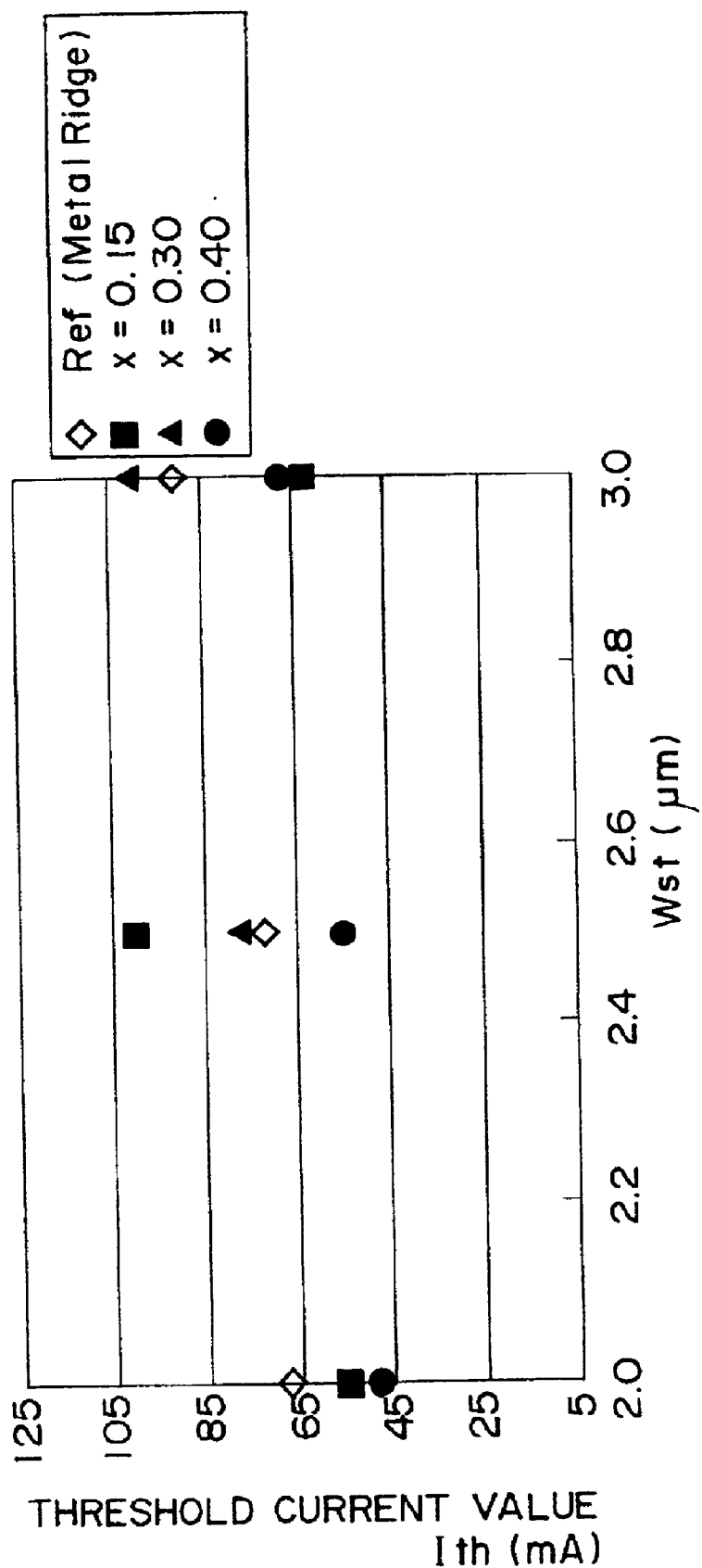
FIG. 6 is a graph showing a relationship between the current injection width Wst and a threshold current value for each of various component ratios "x" of Al.
Figure 7:
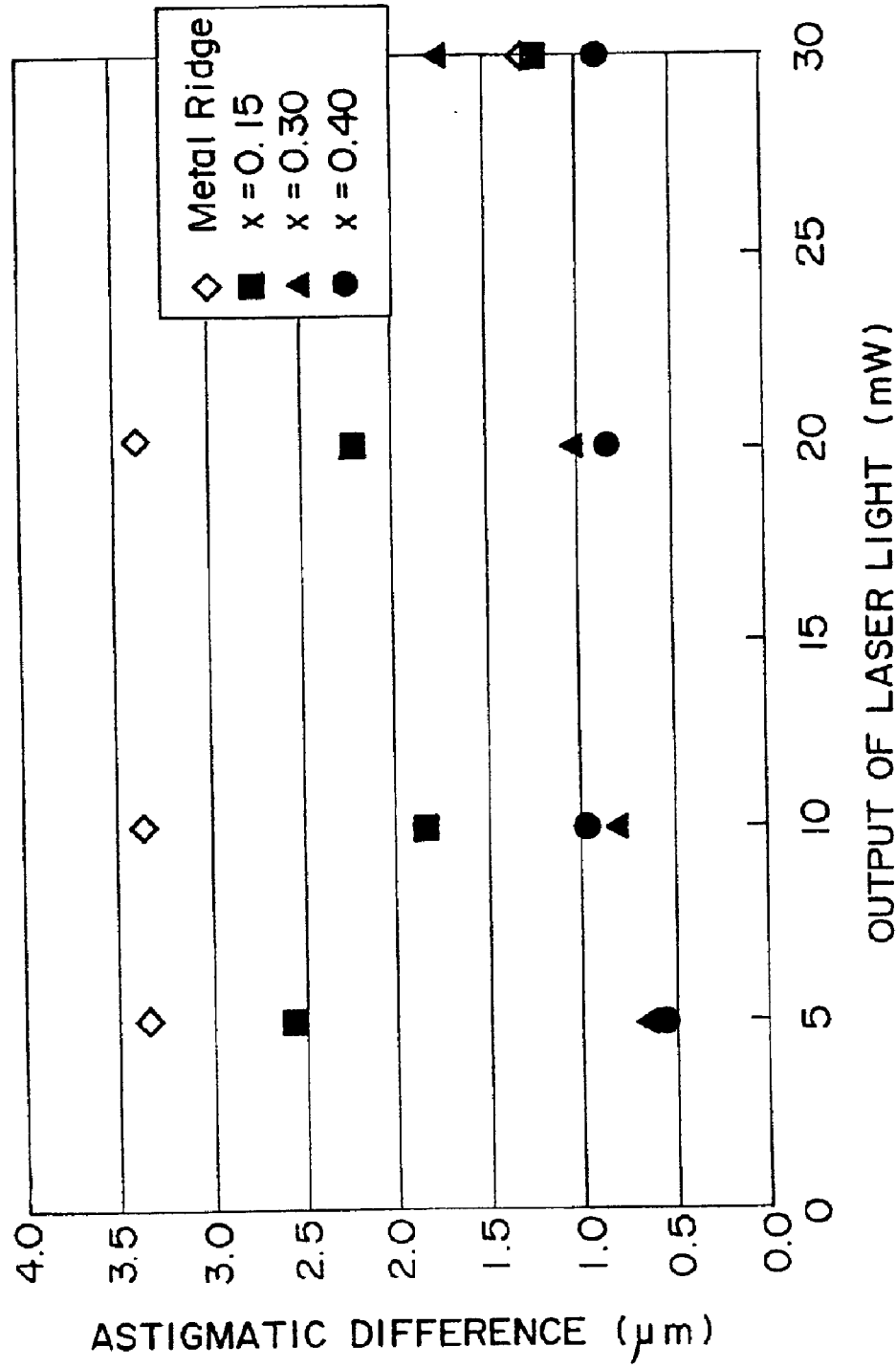
FIG. 7 is a graph showing a relationship between an output of laser light and an astigmatic difference for each of various component ratios "x" of Al.

FIG. 6 shows a relationship between the stripe width Wst (abscissa) and a threshold current value (ordinate) at each component ratio "x" of Al; FIG. 7 shows a relationship between the output of laser light (abscissa) and an astigmatism difference (ordinate) at each component ratio "x" of Al; and FIG. 8 shows a relationship between the output of laser light (abscissa) and the FWHM θ∥ (ordinate) at each component ratio "x" of Al.

As shown in FIG. 6, as a result of comparison at the same stripe width, the threshold current value of the gain guide is higher and the threshold current value of the index guide type is lower. As shown in FIG. 7, a variation in astigmatism difference at each of the component ratios "x" (=0.30 and 0.40) of Al is lower than that at the component ratio "x" (=0.15) of Al over a range from a low power region to a high power region. This is compatible with the well-known fact that the astigmatism difference of the index guide type is lower than that of the gain guide type.

Figure 8:
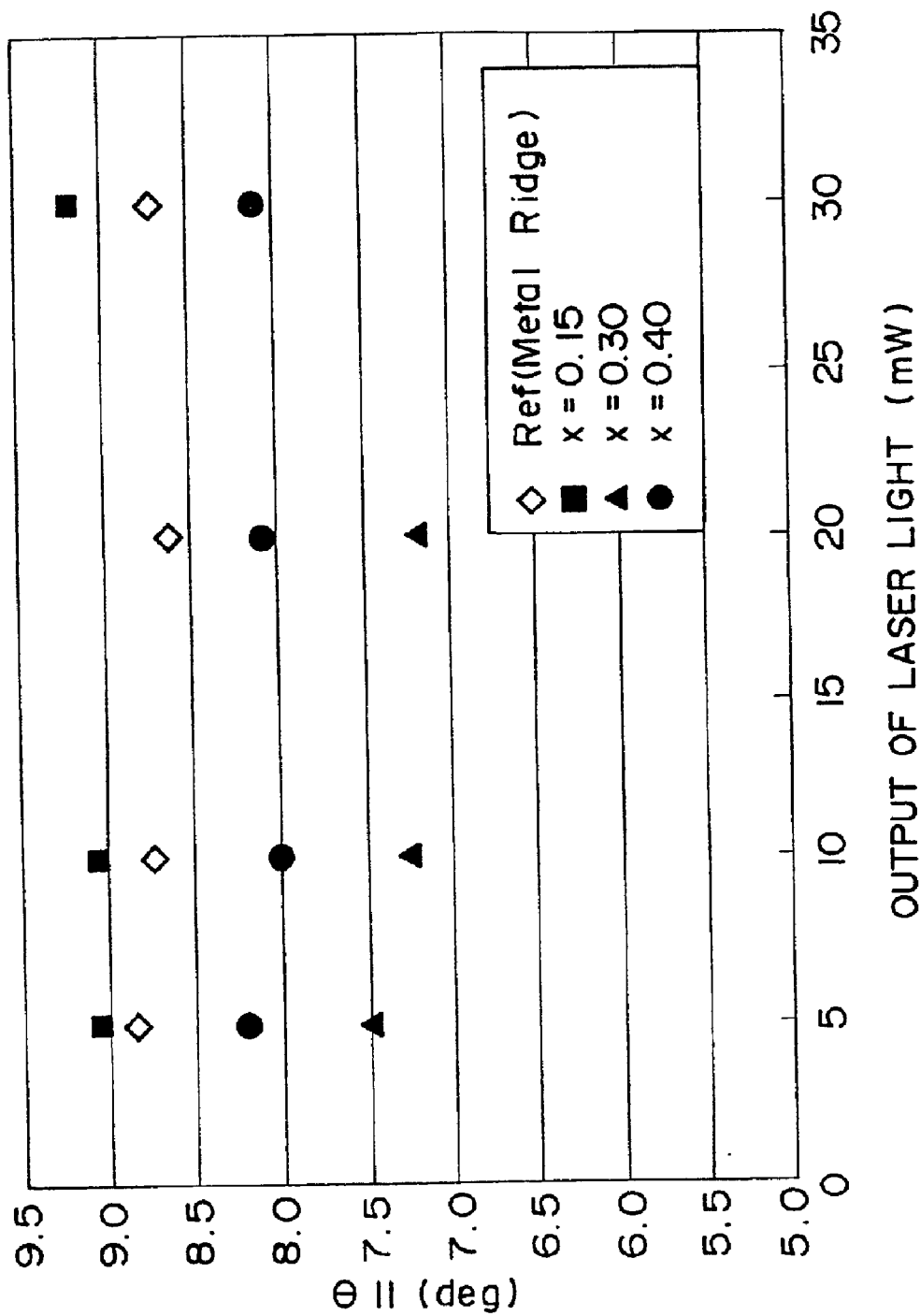
FIG. 8 is a graph showing a relationship between an output of laser light and the FWHM θ∥ for each of various component ratios "x" of Al.

From results shown in FIGS. 6, 7 and 8, it becomes apparent that the gain guide type is, as described above, certainly changed into the index guide type at the component ratio "x" (=0.30) of Al, and the semiconductor laser light emitting device in which the component ratio "x" of Al is specified at 0.30 exhibits a stable, higher output of laser light, and that the device in which the component ratio "x" of Al is specified at 0.40 is suitable for drive at a lower drive power and a higher output. In addition, if Wst>3.5 μm, the characteristics are degraded because the transverse mode becomes unstable as will be described later.

As described above, if the component ratio "x" of Al is specified in the range of 1.0≦x≦0.30, the light waveguide mechanism becomes the index guide type suitable for drive at a lower drive current and a higher output. That is to say, the first semiconductor laser light emitting device of the present invention is intended to have the index guide type waveguide mechanism by specifying the component ratio "x" of Al in the range of 1.0≦x≦0.30. In other words, by specifying the component "x" of Al in the range of 1.0≦x≦0.30, the index guide type group III nitride semiconductor laser light emitting device can be produced.

If the component ratio "x" of Al is specified in a range of 1.0≦x≦0.40, the astigmatism becomes as very small as 1 μm or less. The small astigmatism means that a beam size, that is, a spot size at a focal position at the time of convergence of laser light is small. Accordingly, the first semiconductor laser light emitting device in which the component ratio "x" of Al is specified in the 1.0≧x≧0.40 is suitable for a system making use of the convergence of laser light, for example, a high density optical disk system. Such a device is also excellent in stability of power, and is thereby suitable for a system using a higher output of laser light, for example, an RAM system.

On the other hand, if the component ratio "x" of Al is specified in the range of 0≦x≦0.15, the light waveguide mechanism becomes the gain guide type suitable for drive with a low laser noise. In the general gain guide type semiconductor laser light emitting device such as the AlGaAs based or AlGaInP based semiconductor light emitting device, the built-in Δn is set to zero; however, even if the built-in differential refractive index Δn is not set to zero, a gain guide type semiconductor laser light emitting device can be realized because if the differential refractive index Δn is small, the waveguide mechanism is controlled by a distribution of carriers depending on a distribution of refractive indexes.

As described above, from the results shown in FIGS. 2 and 5, it becomes apparent that if the component ratio "x" of Al is specified in the range of 0≦x≦0.15, the light waveguide mechanism sufficiently acts as the gain guide waveguide mechanism.

On the basis of the above-described result, the third semiconductor laser light emitting device of the present invention is accomplished, and is therefore intended to have the gain guide type waveguide mechanism by specifying the component ratio "x" of Al in the range of 0≦x≦0.15. By the way, in the group III nitride semiconductor laser light emitting device, any means other than formation of a ridge structure for current constriction has not been established, and accordingly, the gain guide type semiconductor laser light emitting device must be produced with the built-in differential refractive index weakened. On the other hand, the thickness d2 must be made small for controlling leak current to the outside of the ridge structure. For this reason, the refractive index of a material covering the outside of the ridge structure may be desirable to be close to that of gallium nitride. From this viewpoint, even if the current constriction portion is formed of air or an insulating film made from silicon oxide ($SiO_2$), silicon nitride (SiN), or aluminum oxide ($Al_2O_3$) as in the related art group III semiconductor laser light emitting device, it becomes difficult to realize a gain guide type group III nitride semiconductor laser light emitting device. Accordingly, to realize a gain guide type group III nitride semiconductor laser light emitting device, it is very important to use $Al_xGa_{1-x}N$ ($0 \leq x \leq 0.15$) as the buried material as in the third semiconductor laser light emitting device of the present invention.

Further, when the component ratio "x" of Al is specified in the range of $0.15 < x < 0.30$, the differential refractive index $\Delta n$ is too small to realize the index guide type waveguide mechanism. The waveguide mechanism realized at a component ratio "x" of Al in the range of $0.15 < x < 0.30$ is equivalent to the weak index guide type waveguide mechanism of the AlGaAs based semiconductor laser light emitting device or AlGaInP based semiconductor laser light emitting device. The weak index waveguide mechanism required to produce a self-pulsation type group III nitride semiconductor laser light emitting device is realized at a component ratio "x" of Al in the range of $0.15 < x < 0.30$. On the basis of such knowledge, the second semiconductor laser light emitting device of the present invention has been accomplished.

From the above description, it becomes apparent that in the first, second, and third semiconductor laser light emitting devices of the present invention, the waveguide mechanism of the device is selected depending on the component ratio "x" of Al of the $Al_xGa_{1-x}N$ layer as the buried layer, as follows:

In the first semiconductor laser light emitting device, the component ratio "x" of Al required to realize the index guide mechanism is specified in the range of $0.3 \leq x \leq 1.0$, preferably, $0.4 \leq x \leq 1.0$.

In the second semiconductor laser light emitting device, the component ratio "x" of Al required to realize the weak index type self-pulsation mechanism is specified in the range of $0.15 < x < 0.30$.

In the third semiconductor laser light emitting device, the component ratio "x" of Al required to realize the gain guide mechanism is specified in the range of $0 \leq x \leq 0.15$.

Figure 9:
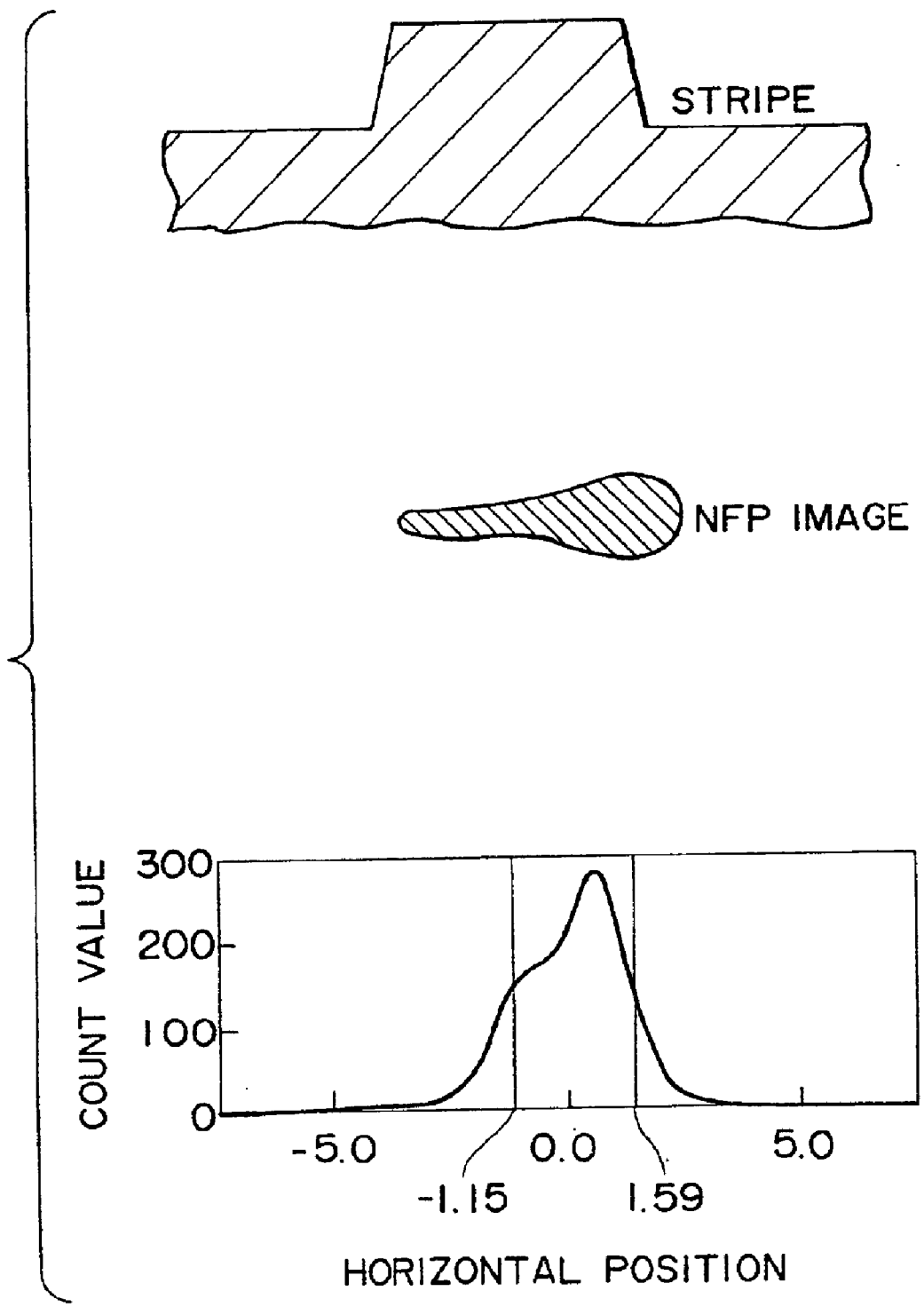
FIG. 9 is a view showing an NFP (Near Field Pattern) image in the horizontal direction and its profile when a current injection width is larger than 3 μm (Wst>3 μm)

The effect of the stripe width Wst more than 3.0 μm will be described below. In general, as the stripe width Wst becomes larger, the waveguide mechanism becomes weaker and thereby light confinement in the horizontal direction becomes unstable. As shown in FIGS. 2 and 5, if Wst>3.0 μm, the waveguide mechanism tends to act as the gain guide mechanism for all the component ratios "x" of Al. In this way, if Wst>3.0 μm, since light confinement is not sufficiently generated, the group III nitride semiconductor laser light emitting device acts as the device of a gain guide type (or a type in which the gain guide type is predominant). Further, as shown by an NFP (Near Field Pattern) in the horizontal direction in FIG. 9, if Wst>3.0 μm, laser light is deflected to the edge of the ridge structure. This shows that the transverse mode is unstable.

The present invention is intended not only to classify the waveguide mechanism but also to reduce a drive current. If it is intended to produce the group III nitride semiconductor laser light emitting device of the gain guide type (or the type in which the gain guide mechanism is predominant) without examination of reduction in drive current, the stripe width Wst may be set to a value in the range of Wst>3 μm. However, as the stripe width Wst becomes larger, the drive current and the threshold current become larger. Even in the gain guide type semiconductor laser light emitting device suitable for drive with low laser noise, it is easily understood that a low drive current and a low threshold current be desirable from the practical viewpoint.

Accordingly, in each of the first, second, and third semiconductor laser light emitting device of the present invention, at the component ratio "x" of Al in the specific range, the stripe width Wst may be desirable to be made as small as possible in order to satisfy the needs of users for the group III nitride semiconductor laser light emitting device. For this reason, it may be desirable from the practical viewpoint that the semiconductor laser light emitting device of the present invention be altered into the index guide type, gain guide type, or weak index self-pulsation type by changing the component ratio "x" of Al in the above-described specific range while suppressing the stripe width Wst to a value in the range of Wst≦3 μm.

Accordingly, in the first semiconductor laser light emitting device, the stripe width Wst is specified in the range of 1 μm≦Wst≦3 μm at a component ratio "x" of Al in the range of $0.3 \leq x \leq 1.0$ which is required to realize the index guide mechanism.

In the second semiconductor laser light emitting device, the stripe width Wst is specified in the range of 1 μm≦Wst≦3 μat a component ratio "x" of Al in the range of $0 \leq x \leq 0.15$ which is required to realize the gain guide mechanism.

In the third semiconductor laser light emitting device, the stripe width Wst is specified in the range of 1 μm≦Wst≦3 μm at a component ratio "x" of Al in the range of $0.15 \leq x \leq 0.30$ which is required to realize the weak index type self-pulsation mechanism.

The effect of the thickness d2 will be described below. As described above, for the ridge type semiconductor laser light emitting device, the thickness d2 is a structural parameter which exerts an effect on the amount of leak current to the outside of the ridge structure, and also a structural parameter for controlling the differential refractive index $\Delta n$.

Figure 10:
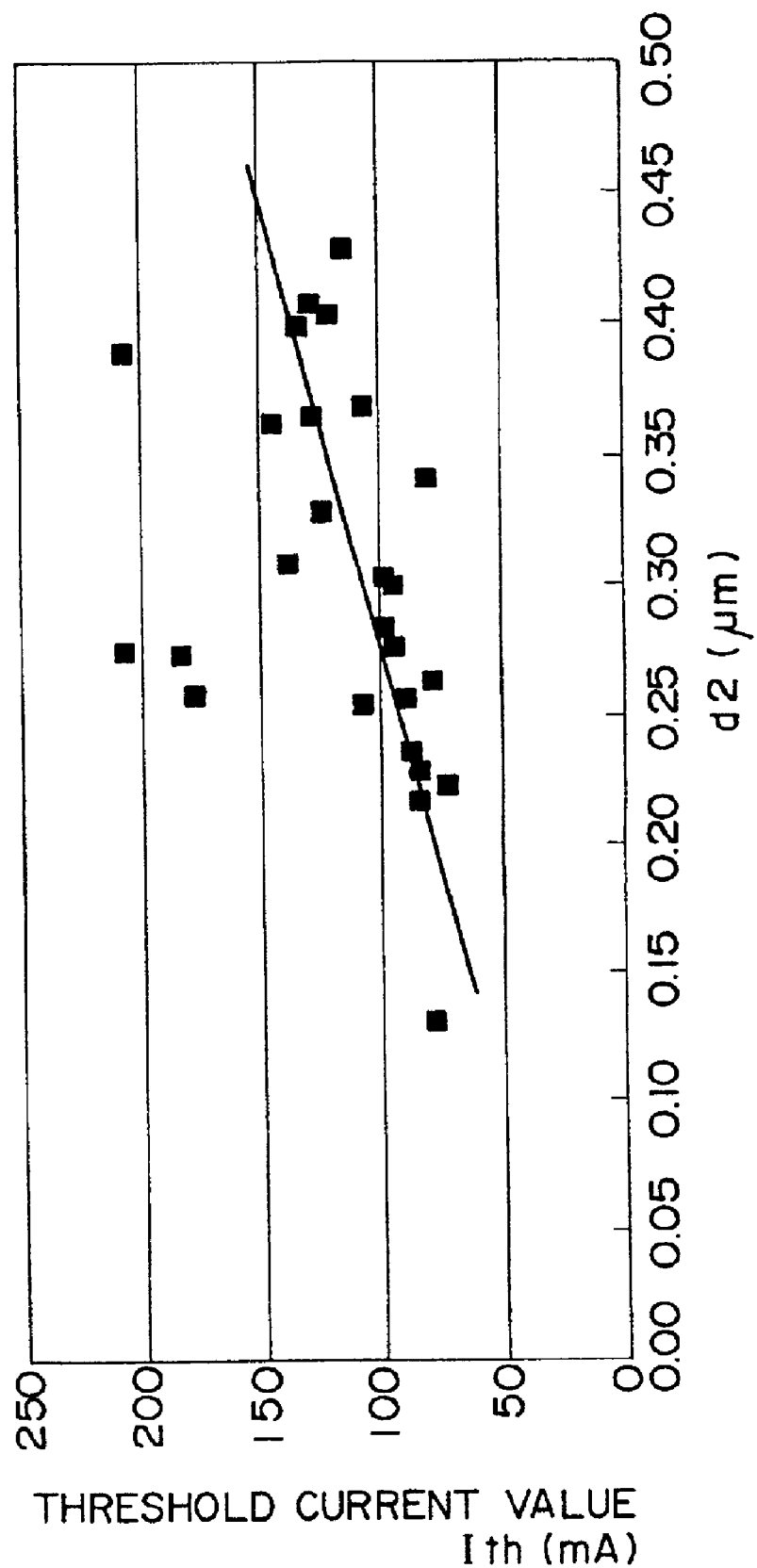
FIG. 10 is a graph showing a relationship between a thickness d2 from an active layer and a current non-injection region and a threshold current value Ith.

FIG. 10 shows a relationship between the thickness d2 (abscissa) and the threshold current value Ith (ordinate). It is to be noted that in the device used for measurement of the relationship shown in FIG. 10, a silicon oxide layer is used as the ridge type buried layer in place of the $Al_xGa_{1-x}N$ layer shown in FIG. 1. The stripe width Wst is fixed to 2.5 μm, and the length of the resonance is set to 700 μm. As will be described later, in the range of the thickness d2 shown in the figure, since the dependence of the thickness d2 on the differential refractive index $\Delta n$ is weak, the change in threshold value Ith is due to the leak current. In this way, even in the group III nitride semiconductor laser light emitting device, the thickness d2 is the structural parameter which exerts an effect on the amount of the leak current.

A relationship between the differential refractive index $\Delta n$ and the thickness d2 will be examined by using a waveguide simulator of a type in which simulation is performed by an effective index method. First, a calculated result by the waveguide simulator is compared with a measured value of the FFP for ensuring the validity of the calculated result by the simulator.

For the semiconductor laser light emitting device 1 having the structure shown in FIG. 1, a typical measured value of $\theta \perp$ at x=0.4 is 24.1°, while a calculated value of $\theta \perp$ by the simulator is 23.8°. In addition, as a result of simulation by the simulator, an effective refractive index is 2.515 and the order of mode is $10^{th}$ order. In this way, the calculated value by the simulator significantly conforms to the measured value, and accordingly, it becomes apparent that the performance of the waveguide simulator used for the present invention is sufficient.

Figure 11:
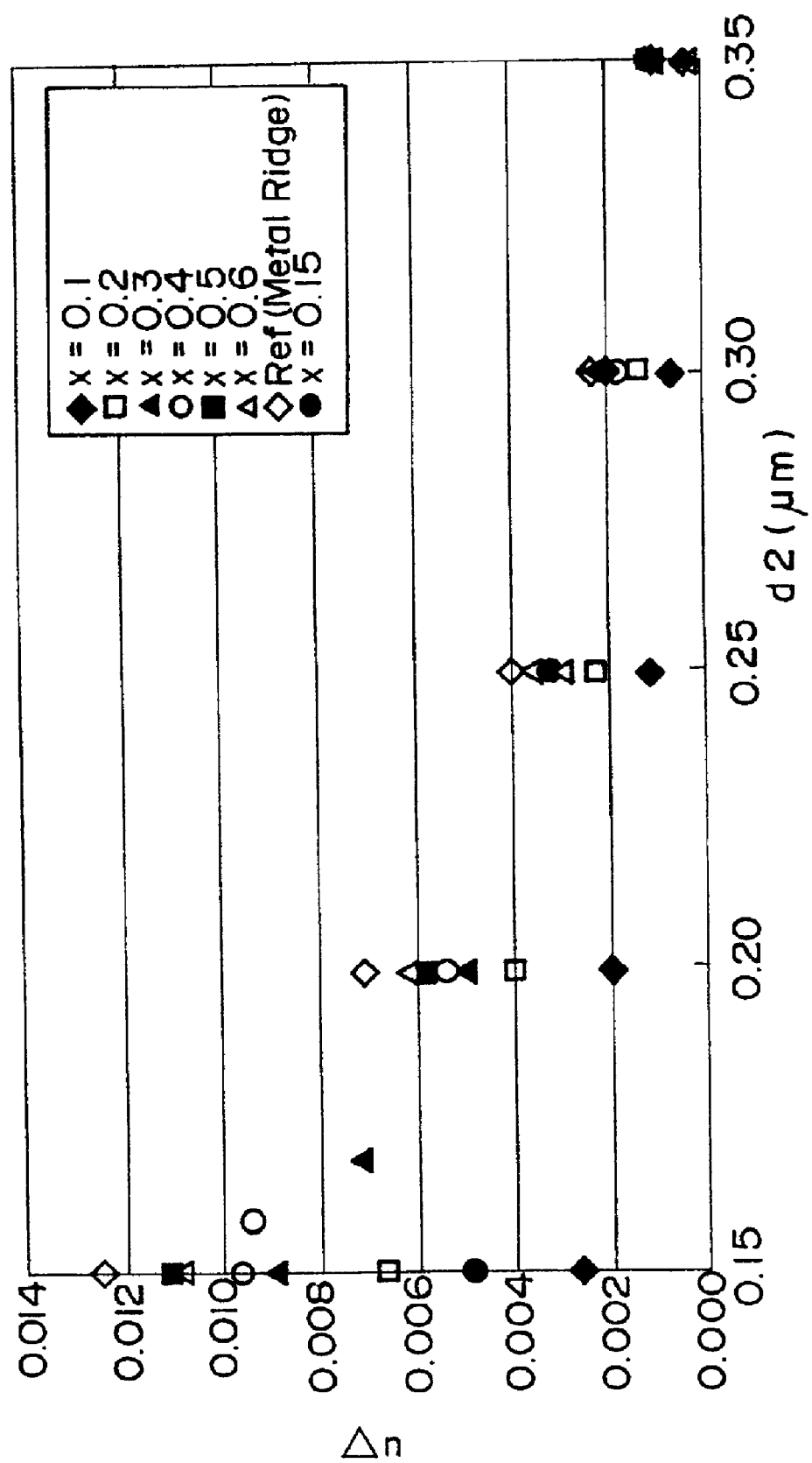
FIG. 11 is a graph showing a result of calculating a relationship between the thickness d2 and the differential refractive index Δn.

FIG. 11 shows results of calculating the relationship between the thickness d2 and the differential refractive index $\Delta n$. In this calculation, the stripe width Wst is not taken into account.

As a result of measurement of the sample in which the component ratio "x" of Al is specified at 0.15, when the thickness d2 is 0.15, the differential refractive index Δn becomes too small to realize the index guide type waveguide mechanism. At this time, the built-in differential refractive index Δn becomes 0.005. As a result, at the component ratio "x" (=0.15) of Al, the maximum thickness d2 is limited to a value at which the differential refractive index Δn is 0.005. That is to say, as the result of simulation, for each component ratio "x" of in the specific range in the $Al_xGa_{1-x}N$ layer as the buried layer, it is required that the differential refractive index Δn be specified in the range of Δn≧0.005. Such a result of simulation significantly conforms to the above-described measured result, and therefore, it is confirmed that the calculated result by using the simulator has a validity.

Accordingly, in the first semiconductor laser light emitting device, at a component ratio "x" of Al in the range of 0.3≦x≦1.0 which is required to realize the index guide mechanism, the thickness d2 is specified in the range of d2≦0.2 μm, and more preferably, the stripe width Wst is specified in the range of 1 μm≦Wst≦3.0 μm.

In the second semiconductor laser light emitting device, at a component ratio "x" of Al in the range of 0≦x≦0.15 which is required to realize the gain guide mechanism, the thickness d2 is specified in the range of d2≦0.2 μm, and more preferably, the stripe width Wst is specified in the range of 1 μm≦Wst≦3.0 μm.

In the third semiconductor laser light emitting device, at a component ratio "x" of Al in the range of 0.15<x<0.3 which is required to realize the weak index type self-pulsation mechanism, the thickness d2 is specified in the range of d2≦0.2 μm, and more preferably, the stripe width Wst is specified in the range of 1 μm≦Wst≦3 μm.

Figure 12:
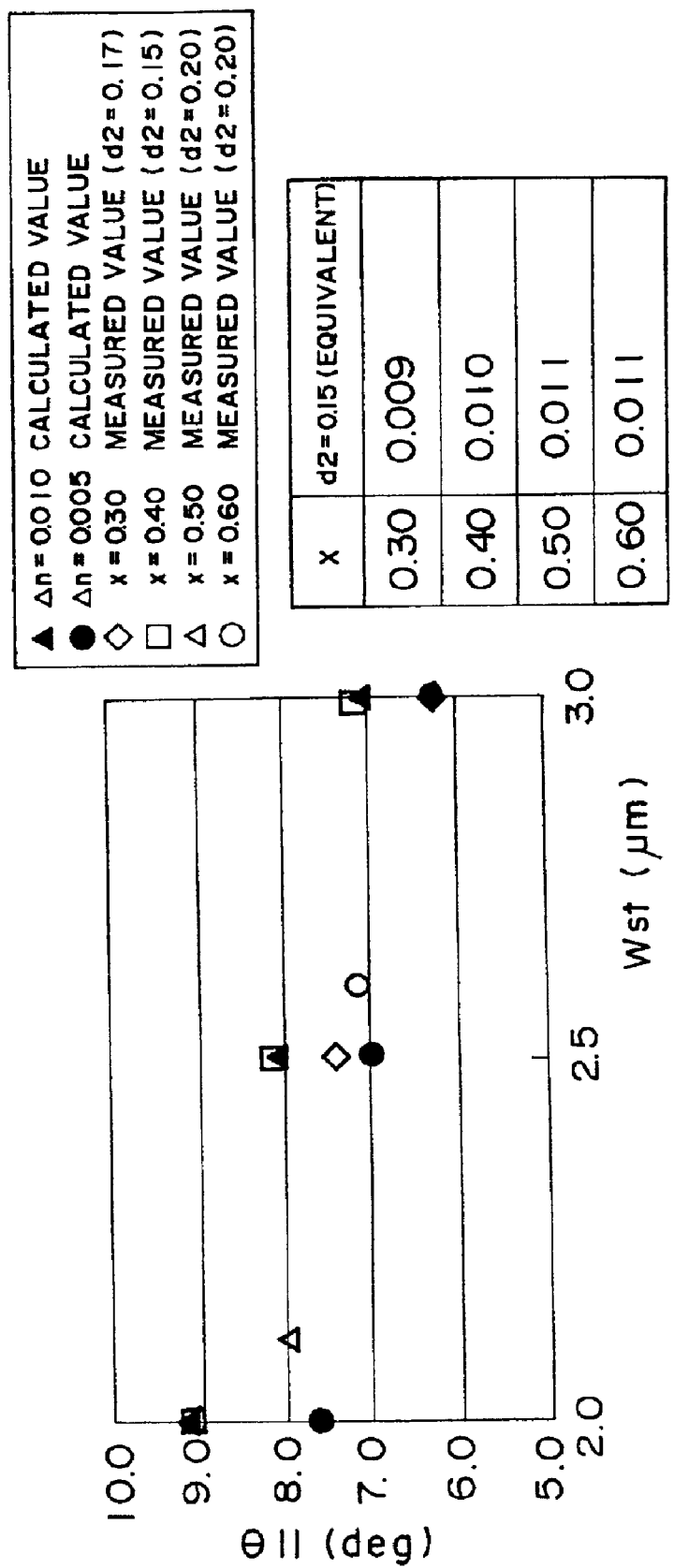
FIG. 12 is a graph showing a relationship between a calculated result of the FWHM θ∥ and the measured value of the current injection width Wst.
Figure 13:
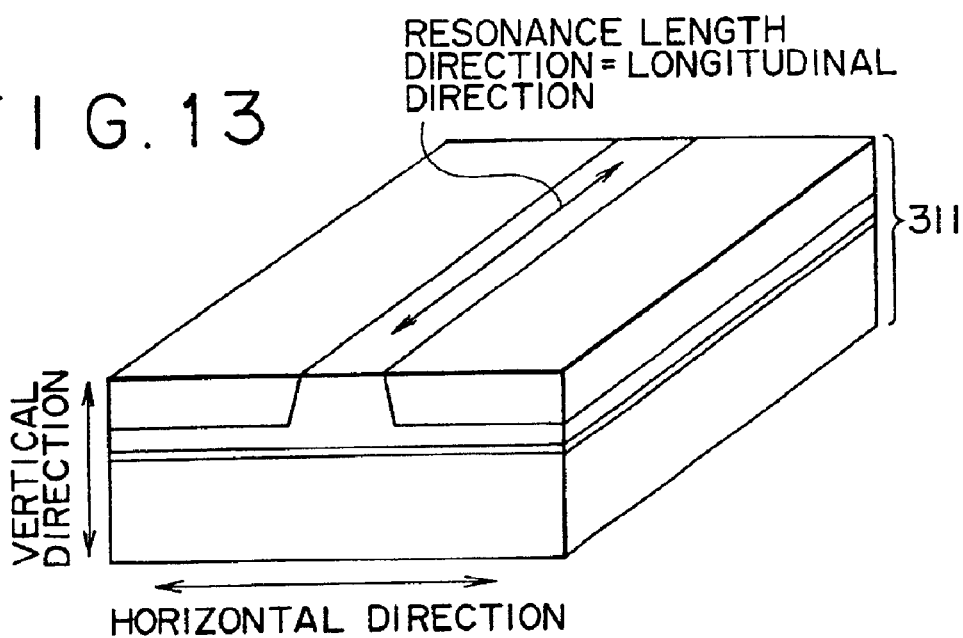
FIG. 13 is a view illustrating the definition of vertical, horizontal and longitudinal directions of a semiconductor laser light emitting device.
Figure 14A:
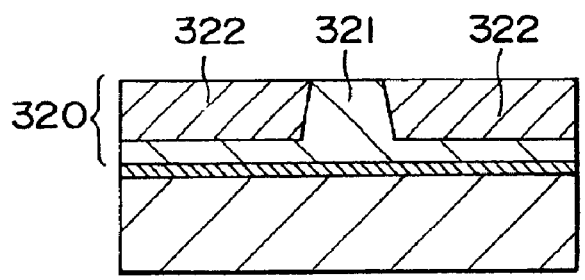
FIG. 14A is a sectional view showing a structure of a gain guide type semiconductor laser light emitting device.
Figure 14B:
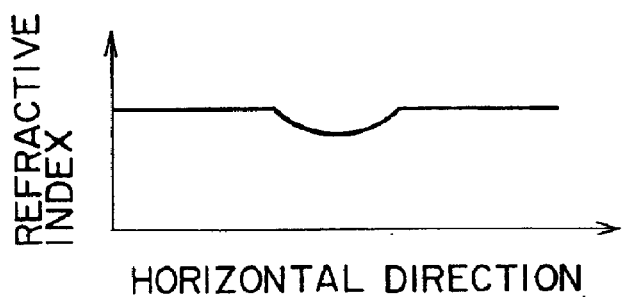
FIG. 14B is a graph showing a distribution of refractive indexes in the device shown in FIG. 14A.
Figure 14C:
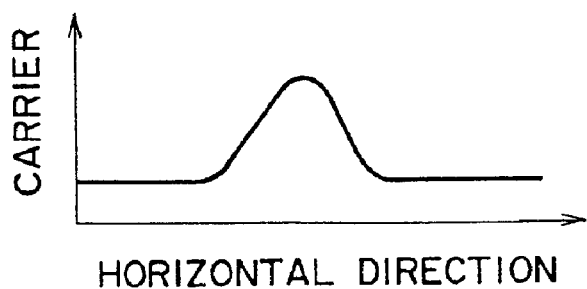
FIG. 14C is a graph showing a distribution of carriers in the device shown in FIG. 14A.
Figure 15A:
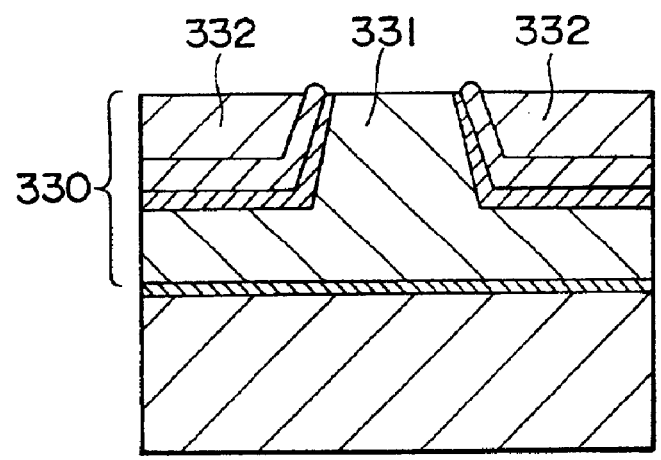
FIG. 15A is a sectional view showing a structure of an index guide type semiconductor laser light emitting device.
Figure 15B:
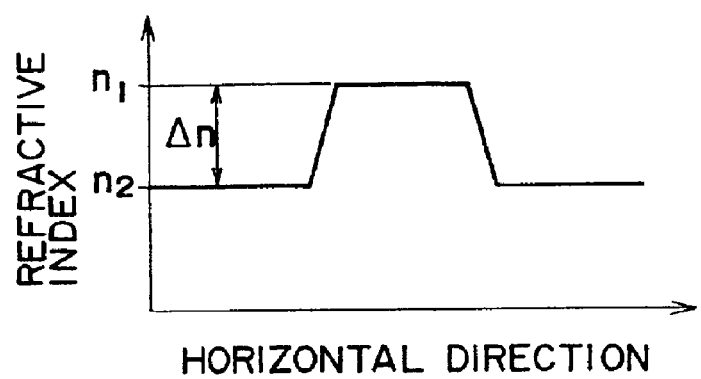
FIG. 15B is a graph showing a distribution of refractive indexes in the device shown in FIG. 15A.
Figure 15C:
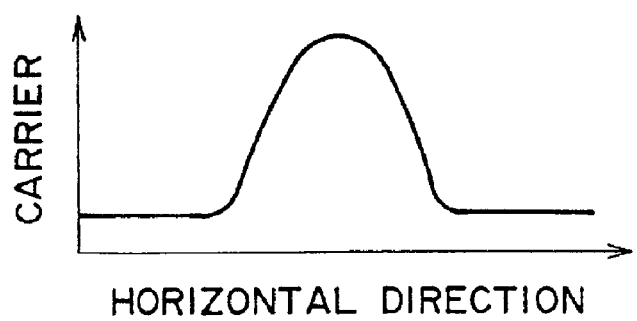
FIG. 15C is a graph showing a distribution of carriers in the device shown in FIG. 15A.

FIG. 12 shows a relationship between a calculated value of θ|| and a measured value of θ||. From the results shown in FIGS. 12 and 11, it becomes apparent that the calculated value of θ|| significantly conforms to the measured value of θ||. Accordingly, it is conformed that the performance of the simulator is sufficient.

From the results shown in FIGS. 2, and 5 to 8, it is apparent that, to realize the index guide type group III nitride semiconductor laser light emitting device, it is required that the component ratio "x" of Al be set to 0.3 and the thickness d2 be set to 0.17 μm, and from the result shown in FIG. 11, it is apparent that, to realize the index guide type group III nitride semiconductor laser light emitting device, it is also required that the differential refractive index Δn be in a range of Δn≧0.007, and from the viewpoints of astigmatism and stability of power, preferably, in the range of Δn>0.01.

In other word, the differential refractive index Δn in a range of Δn<0.007 is too small to realize the index guide type semiconductor laser light emitting device. The differential refractive index Δn in a range of Δn<0.007 generally realizes the weak index waveguide mechanism, and the gain guide mechanism, and further, the weak index type self-pulsation mechanism. Additionally, it is due to the volume of the active layer whether or not pulsation occurs.

Accordingly, in the first semiconductor laser light emitting device, at a component ratio "x" of Al in the range of 0.3≦x≦1.0 which is required to realize the index guide mechanism, the differential refractive index Δn is specified in the range of 0.007≦x≦0.012, and more preferably, the stripe width Wst is specified in the range of 1 mμm≦Wst≦3 μm and the thickness d2 is specified in the range of d2≦0.2 μm.

In the second semiconductor laser light emitting device, at a component ratio "x" of Al in the range of 0≦x≦0.15 which is required to realize the gain guide mechanism, the differential refractive index Δn is specified in the range of 0<x<0.007, and more preferably, the stripe width Wst is specified in the range of 1 μm≦Wst≦3 μand the thickness d2 is specified in the range of d2≦0.2 μm.

In the third semiconductor laser light emitting device, at a component ratio "x" of Al in the range of 0.15<x<0.3 which is required to realize the weak index type self-pulsation mechanism, the differential refractive index Δn is specified in the range of 0<x<0.007, and more preferably, the stripe width Wst is specified in the range of 1 μm≦Wst≦3 μand the thickness d2 is specified in the range of d2≦0.2 μm.

According to the above-described embodiments, the setting of the range of each structural parameter is performed by example of the semiconductor laser light emitting device having the structure shown in FIG. 1; however, since the light waveguide mechanism is determined by the differential refractive index Δn on the basis of the principle of the photo-field, such structural parameters of the present invention is applicable to a semiconductor laser light emitting device other than that shown in FIG. 1, insofar as the semiconductor laser light emitting device includes a stacked film composed of a stack of group III nitride semiconductor films each containing at least one kind selected from aluminum, gallium, indium, and boron; wherein an upper portion of the stacked film is formed into a ridge-like stripe, to form a current injection region; a current non-injection region formed on both sides of the ridge-like stripe; and at least part of the current non-injection region is made from a material expressed by a chemical formula $Al_xGa_{1-x}N$ (0≦x≦1.0)

According to the above-described embodiments, the single $Al_xGa_{1-x}N$ layer is used as the buried layer; however, a stack of a plurality of $Al_xGa_{1-x}N$ layers (x differs for each layer) may be used as the buried layer. In this case, if an average value of the component ratios "x" of Al of the $Al_xGa_{1-x}N$ layers is in the range specified for the single $Al_xGa_{1-x}N$ layer according to the present invention, the semiconductor laser light emitting device including the plurality of $Al_xGa_{1-x}N$ layers is structurally equivalent to the semiconductor laser light emitting device including the single $Al_xGa_{1-x}N$ layer described in the embodiments, and if the differential refractive index Δn for the plurality of $Al_xGa_{1-x}N$ layers is equal to that for the single $Al_xGa_{1-x}N$ layer, the device including the plurality of $Al_xGa_{1-x}N$ layers is quite equivalent in waveguide mechanism to the device including the single $Al_xGa_{1-x}N$ layer described in the embodiments. Accordingly, the present invention is apparently applicable to a semiconductor laser light emitting device in which the buried layer is formed of a plurality of $Al_xGa_{1-x}N$ layers insofar as an average component ratio "x-ave" of Al of the $Al_xGa_{1-x}N$ layers is equal to the component ratio "x" of Al of the single $Al_xGa_{1-x}N$ layer of the semiconductor laser light emitting device described in the embodiments. It should be noted that an average component ratio of Al is defined as $[\Sigma i\{(\text{refractive index } i)\times(\text{film thickness } i)\times(\text{photo-ratio } i)\}]/[\Sigma i\{(\text{film thickness } i)\times(\text{photo-ratio } i)\}] = A_{x\text{-}ave}Ga_{1-(x\text{-}ave)}N$. Here, Σi indicates the sum for respective films constituting the stacked buried layer, the number of each film being expressed by "i", and the photo-ratio may be, when the distribution of the photo-field is standardized outside the ridge structure, an area occupied by the layer "i".

In the above-described embodiments, the sapphire substrate is used; however, since the light confinement in the vertical direction is sufficient and thereby light does not reach the substrate position, a substrate other than the sapphire substrate, for example, a substrate made from a compound semiconductor such as gallium nitride or silicon may be used.

In the above-described embodiments, the single $Al_xGa_{1-x}N$ is used as the buried layer; however, indium may be further contained in the buried layer. For example, in the structure shown in FIG. 1, an $In_yGa_{1-y}N$ ($y \geq 0.16$) layer may be formed on side surfaces of the ridge structure to a thickness, for example, 10 nm before the buried layer is formed of the $Al_xGa_{1-x}N$ layer. With this configuration, a light absorbing layer is built-in on the side surfaces of the ridge structure.

In the case where the above light absorbing layer is present, the basic mode of light waveguide in the horizontal direction little receives the effect of the light absorbing layer but the higher mode of the first order or more of light waveguide in the horizontal direction receives the light distribution of the light absorbing layer. To be more specific, an absorption loss becomes large at the higher mode. This means that a difference in threshold value between the basis mode and the higher mode becomes large. Accordingly, an output of light for switching the waveguide mode from the basis mode to the higher mode can be made higher. At this time, the switching therebetween appears as a kink of the L-I characteristic.

Accordingly, the formation of the light absorbing layer is desirable in stabilization of the transverse mode at a higher output. The present invention is applied to the case of forming the light absorbing layer as part of the buried layer by using an average component ratio of Al defined as $[\Sigma i\{(\text{refractive index i}) \times (\text{film thickness i}) \times (\text{photo-ratio i})\}]/[\Sigma i\{(\text{film thickness i}) \times (\text{photo-ratio i})\}] = A_{x\text{-}ave}Ga_{1-(x\text{-}ave)}N$. This is clear from the viewpoint of waveguide.

Further, the values of the differential refractive indexes $\Delta n$, specified in the present invention, can be applied to a dielectric film made from $SiO_2$ or SiN.

As described above, each of the first, second, and third semiconductor laser light emitting devices of the present invention, which includes a stack of group III nitride semiconductor films each containing at least one kind selected from aluminum, gallium, indium, and boron, is advantageous in terms of:

(1) realizing a group III nitride semiconductor laser light emitting device suitable for drive at a low drive power and a higher output;

(2) realizing a group III nitride semiconductor laser light emitting device capable of reducing the effect of return light; and (3) allowing easy development of a semiconductor laser light emitting device having a structure equivalent in waveguide mechanism to the device of the present invention because the component ratio of Al, differential refractive index $\Delta n$, thickness d2, and stripe width Wst are in correspondence with the waveguide mechanism, thereby promoting the practical use of group III nitride semiconductor laser light emitting devices.

While the preferred embodiments of the present invention have been described using the specific terms, such description is for illustrative purposes only, and it is to be understood that changes and variations may be made without departing from the spirit or scope of the following claims.

What is claimed is:

1. A semiconductor laser light emitting device comprising:

a stack of group III nitride semiconductor films;

wherein each group III nitride semiconductor film comprises an element selected from the group consisting of aluminum, gallium, indium, and boron;

wherein, an upper portion of said stack of group III nitride semiconductor films is formed into a ridge-like stripe, to form a current injection region;

wherein a current injection width Wst of said current injection region is at a value in a range of 1 $\mu m \leq Wst \leq 3$ $\mu m$; and wherein said current injection region is formed on an active layer;

a current non-injection region formed on both sides of said ridge-like stripe current injection region, wherein said cm-rent non-injection region comprises a material expressed by a chemical formula $Al_xGa_{1-x}N$, wherein the component ratio "x" of Al is at a value in a range of $0.3 \leq x \leq 1.0$; and a film located between the active layer and the current non-injection region, comprising a material expressed by a chemical formula $Al_xGa_{1-x}N$ ($0.3 \leq x \leq 1.0$), and having a combined thickness of less than or equal to 0.2 $\mu m$ but greater than zero.

2. A semiconductor laser light emitting device according to claim 1, wherein a difference $\Delta n$ between an effective refractive index n1 of said current injection region in the film stacking direction and an effective refractive index n2 of said current non-injection region in the film stacking direction is in a range of $0.007 \leq \Delta n = (n1-n2) \leq 0.012$.

3. A semiconductor laser light emitting device comprising:

a stack of group III nitride semiconductor films;

wherein each group III nitride semiconductor film comprises an element selected from the group consisting of aluminum, gallium, indium, and boron;

wherein, an upper portion of said stack of group III nitride semiconductor films comprises is formed into a ridge-like stripe, to form a current injection region;

wherein a current injection width Wst of said current injection region is at a value in a range of 1 $\mu m \leq Wst \leq 3$ $\mu m$; and wherein said current injection region is formed on an active layer;

a current non-injection region formed on both sides of said ridge-like stripe current injection region, wherein said current non-injection region comprises a material expressed by a chemical formula $Al_xGa_{1-x}N$, wherein the component ratio "x" of Al is at a value in a range of $0.15 < x < 0.30$; and wherein the group III nitride semiconductor films located between the active layer and the current non-injection region, comprises a material expressed by a chemical formula $Al_xGa_{1-x}N$ ($0.15 \leq x \leq 0.30$), and have a combined thickness of less than or equal to 0.2 $\mu m$ but greater than zero.

4. A semiconductor laser light emitting device according to claim 3, wherein a difference $\Delta n$ between an effective refractive index n1 of said current injection region in the film stacking direction and an effective refractive index n2 of said current non-injection region in the film stacking direction is in a range of $0 < \Delta n = (n1-n2) < 0.007$.

5. A semiconductor laser light emitting device comprising:

a stack of group III nitride semiconductor films;

wherein each group III nitride semiconductor film comprises an element selected from the group consisting of aluminum, gallium, indium, and boron;

wherein, an upper portion of said stack of group III nitride semiconductor films forms a ridge-like stripe for a current injection region;

wherein a current non-injection region formed on both sides of said ridge-like stripe current injection region, wherein said current non-injection region comprises a material expressed by a chemical formula $Al_xGa_{1-x}N$; and a film located between an active layer and the current non-injection region, comprising a material expressed by a chemical formula $Al_xGa_{1-x}N$ ($0.15 \leq x \leq 0.30$), and having a combined thickness of less than or equal to 0.2 $\mu$m but greater than zero.

* * * * *